(12) United States Patent
Tobenas Borron

(10) Patent No.: US 11,914,328 B2
(45) Date of Patent: Feb. 27, 2024

(54) PROCESS FOR TREATING A SURFACE OF A TIMEPIECE COMPONENT, AND TIMEPIECE COMPONENT OBTAINED FROM SUCH A PROCESS

(71) Applicant: ROLEX SA, Geneva (CH)

(72) Inventor: Susana del Carmen Tobenas Borron, Brügg (CH)

(73) Assignee: ROLEX SA, Geneva (CH)

( * ) Notice: Subject to any disclaimer, the term of this patent is extended or adjusted under 35 U.S.C. 154(b) by 1259 days.

(21) Appl. No.: 16/418,023

(22) Filed: May 21, 2019

(65) Prior Publication Data

US 2019/0271947 A1 Sep. 5, 2019

Related U.S. Application Data

(62) Division of application No. 14/412,845, filed as application No. PCT/EP2013/064413 on Jul. 8, 2013, now Pat. No. 10,372,083.

(30) Foreign Application Priority Data

Jul. 6, 2012 (EP) ..................................... 12175240

(51) Int. Cl.
*G04B 17/06* (2006.01)
*C23C 16/40* (2006.01)
(Continued)

(52) U.S. Cl.
CPC ............ *G04B 17/066* (2013.01); *C23C 16/32* (2013.01); *C23C 16/34* (2013.01); *C23C 16/40* (2013.01);
(Continued)

(58) Field of Classification Search
CPC . G04B 17/066; C23C 16/40; C23C 16/45525; Y10T 428/24942
See application file for complete search history.

(56) References Cited

U.S. PATENT DOCUMENTS 5,881,026 A 3/1999 Baur et al.
6,705,601 B2 3/2004 Baur et al.
(Continued)

FOREIGN PATENT DOCUMENTS

CH 702 353 A2 6/2011
CN 1268682 A 10/2000
(Continued)

OTHER PUBLICATIONS

Japanese Office Action dated Mar. 14, 2017 in Japanese application No. 2015-519249 corresponding to parent (with English machine translation; 6 pages) (D1 CH702353 cited in the Japanese Office Action is not listed in this IDS since it was submitted in the IDS filed Iconcurrently).

(Continued)

*Primary Examiner* — Laura A Auer
(74) *Attorney, Agent, or Firm* — WHDA, LLP

(57) ABSTRACT

A method for treating a surface (2) of a base (1) of a timepiece component (10), in particular a balance spring, e.g. a balance spring made of a paramagnetic NbZr alloy, includes: a first step of depositing a first layer (41) of a first oxide or first nitride or first carbide; and a second step of depositing a second layer (51) of a second oxide or second nitride or second carbide.

20 Claims, 5 Drawing Sheets

(51) Int. Cl.
  *C23C 16/455* (2006.01)
  *C23C 16/32* (2006.01)
  *C23C 16/34* (2006.01)
(52) U.S. Cl.
  CPC . *C23C 16/45525* (2013.01); *Y10T 428/24942* (2015.01)

(56) References Cited

U.S. PATENT DOCUMENTS

| | | |
|---|---|---|
| 7,077,562 B2 | 7/2006 | Bourgeois et al. |
| 2002/0180130 A1 | 12/2002 | Baur et al. |
| 2003/0224201 A1 | 12/2003 | Kawakami |
| 2005/0281137 A1 | 12/2005 | Bourgeois et al. |
| 2011/0236654 A1 | 9/2011 | Hsu et al. |
| 2011/0292770 A1* | 12/2011 | Damasko ............ G04B 17/066 368/175 |
| 2012/0100305 A1 | 4/2012 | Muller |
| 2012/0314546 A1 | 12/2012 | Brewer et al. |
| 2013/0094333 A1 | 4/2013 | Ito et al. |

FOREIGN PATENT DOCUMENTS

| | | |
|---|---|---|
| CN | 102483607 A | 5/2012 |
| EP | 0 886 195 A1 | 12/1998 |
| EP | 1 039 352 A1 | 9/2000 |
| EP | 1 258 786 A1 | 11/2002 |
| EP | 1 422 436 A1 | 5/2004 |
| EP | 2 273 324 A1 | 1/2011 |
| EP | 2 371 993 A1 | 10/2011 |
| JP | 2000-321371 A | 11/2000 |
| JP | 2005-076085 A | 3/2005 |
| JP | 2011-208275 A | 10/2011 |
| NO | 2011/103317 A1 | 8/2011 |
| WO | 2011/003756 A1 | 1/2011 |

OTHER PUBLICATIONS

Chinese Office Action and Search Report dated Sep. 2, 2016 in Chinese application No. 201380036217.1 corresponding to parent (with English machine translation; 19 pages) 'D2 EP2371993 and D4 CH702353 cited in the Chinese Office Action are not listed in this IDS since they were submitted in the IDS filed concurrently).
International Search Report and Written Opinion dated Nov. 7, 2013 issued in application No. PCT/EP2013/064413 corresponding to parent (with English partial translation and partial machine-translation).
D.R.G. Mitchell et al., "Atomic layer deposition (ALD) of TiO2 and Al2O3 thin films on silicon", Proceedings of SPIE, vol. 5276, Apr. 2, 2004, pp. 296-306 (cited in International Search Report).
J.B. Wachtman, Jr. et al., "Young's Modulus of Various Refractory Materials as a Function of Temperature", Journal of The American Ceramic Society, vol. 42, No. 5, May 1959, pp. 254-260 (Ref. U cited in Office Action dated Jul. 19, 2018 in parent).

* cited by examiner

PROCESS FOR TREATING A SURFACE OF A TIMEPIECE COMPONENT, AND TIMEPIECE COMPONENT OBTAINED FROM SUCH A PROCESS

This application is a divisional of U.S. application Ser. No. 14/412,845, which is a national stage of PCT/EP2013/064413 filed Jul. 8, 2013, each of which claims priority of European application No. EP12175240.6 filed Jul. 6, 2012, the contents of each of which are incorporated by reference herein.

The invention relates to a process for treating a surface of a timepiece component, especially a hairspring, in particular a self-compensating spring. The invention also relates to a timepiece component, especially a hairspring, obtained via such a process. The invention especially relates to such a timepiece component per se. Finally, the invention relates to a timepiece movement or a timepiece item, especially a watch, comprising such a timepiece component.

The existence of frequency drift of a balance-spring oscillator as a function of time is well known to timepiece manufacturers. Thus, an oscillator equipped with a hairspring made of manufacturing crude ferromagnetic alloy may gradually undergo an increase in its frequency to reach a rate variation of the order of 10 s/day after one year. In order to reduce this drift, heat treatments are usually performed, known as oven treatments, which make it possible to reduce the rate drift in the course of the first years to below 1 s/day, which is acceptable, given the other perturbations due to the wearing of the watch, such as impacts.

The same drift phenomenon is found in the case of hairsprings made of paramagnetic alloys, especially of NbZr alloy, as disclosed in patent EP 1 039 352. Contrary to what takes place in the case of hairsprings made of ferromagnetic alloys, the same type of oven treatment does not make it possible to reduce the rate drift below about 5 s/day after one year in the case of a hairspring made of paramagnetic alloy. The solution proposed by patent EP 1 039 352 is to grow a layer of alloy oxide on the surface of the hairspring, especially via an anodization process. This process has the advantage of forming an oxide layer at low temperature, without modifying the crystal structure of the hairspring, of perfectly reproducible thickness (and thus color). However, the anodization process comprises certain drawbacks. Specifically, it takes place in the liquid phase, requires the establishment of an electrical contact between an electrode and the hairspring, cannot be transposed to other types of hairspring such as hairsprings made of Nivarox alloy or of silicon, and is difficult to perform on a hairspring with an assembled collet and/or stud.

In document CH 702 353, it is envisaged to coat a hairspring in order to solve an entirely different problem from that of the invention, namely the frequency stability of the balance-spring oscillator or resonator when the temperature varies, which involves being able to control precisely the thermoelastic coefficient of the hairspring. A coating composed of a layer of silicon dioxide and a layer of germanium dioxide on a silicon core is especially provided. To do this, the core and the coating have thermoelastic coefficients of opposite signs. The coating has a positive thermoelastic coefficient. Moreover, in said document, no indication is given regarding the process or the technique for obtaining such coatings.

The aim of the invention is to provide a process for treating the surface of a timepiece component which makes it possible to solve the drawbacks mentioned previously and to improve the known processes of the prior art. In particular, the invention proposes a surface treatment process for improving the performance of a timepiece component, especially for increasing the performance of a hairspring, in particular for increasing the frequency stability of a balance-spring oscillator equipped with such a hairspring over time.

A treatment process according to the invention is defined by point 1 below.

1. A process for treating a surface of a base of a timepiece component, especially a hairspring, the process comprising:
    a first step of depositing a first layer of a first oxide or of a first nitride or of a first carbide; and
    a second step of depositing a second layer (51) of a second oxide or of a second nitride or of a second carbide.

Various modes of implementation are defined by points 2 to 16 below.

2. A process for treating a surface of a base of a timepiece component, especially a hairspring, the process comprising a first step of depositing a first layer of a first oxide and a second step of depositing a second layer of a second oxide.
3. The process as defined in the preceding point, wherein:
    the first oxide, and/or
    the second oxide, and/or
    both the first oxide and the second oxide in the form of a first layer and a second layer, have a negative thermoelastic coefficient.
4. The process as defined in either of points 2 and 3, wherein the base, on the one hand, and at least one of the layers, on the other hand, have thermoelastic coefficients of opposite signs.
5. The process as defined in one of points 2 to 4, wherein the first oxide is $ZrO_2$ or $TiO_2$ or $HfO_2$ or $ZnO$ or, preferentially, $Al_2O_3$.
6. The process as defined in one of points 2 to 5, wherein the second oxide is different from the first oxide and is $Al_2O_3$ or $ZrO_2$ or $HfO_2$ or $ZnO$ or, preferentially, $TiO_2$.
7. The process as defined in one of points 2 to 6, wherein the base of the timepiece component is made of an alloy of NbZr type or of silicon or of silicon covered with $SiO_2$ or of an alloy of FeNiCr type.
8. The process as defined in one of the preceding points, wherein:
    the thickness of the first layer is between 2 nm and 60 nm, preferably between 2 nm and 15 nm and preferably between 3 nm and 12 nm, or
    with the base of the timepiece component made of an alloy of NbZr type or an alloy of FeNiCr type, the thickness of the first layer is between 2 nm and 15 nm and preferably between 3 nm and 12 nm, or
    with the base of the timepiece component made of silicon or of silicon coated with $SiO_2$, the thickness of the first layer is between 3 nm and 60 nm, preferably between 20 nm and 60 nm and preferably between 40 nm and 60 nm.
9. The process as defined in one of the preceding points, wherein:
    the thickness of the second layer is between 2 nm and 60 nm, preferably between 2 nm and 15 nm and preferably between 3 nm and 12 nm, or
    with the base of the timepiece component made of an alloy of NbZr type or an alloy of FeNiCr type, the thickness of the second layer is between 2 nm and 15 nm and preferably between 3 nm and 12 nm, or
    with the base of the timepiece component made of silicon or of silicon coated with $SiO_2$, the thickness of the second layer is between 3 nm and 60 nm, preferably between 20 nm and 60 nm and preferably between 40 nm and 60 nm.
10. The process as defined in point 1, wherein the first nitride is AlTiCN or AlN or TiN.
11. The process as defined in point 1 or 10, wherein the second nitride is different from the first nitride and is AlTiCN or AlN or TiN.
12. The process as defined in one of the preceding points, wherein the first layer and/or the second layer have a nanometric thickness.
13. The process as defined in one of the preceding points, wherein the first layer and/or the second layer are deposited via a procedure of ALD deposition type.
14. The process as defined in one of the preceding points, wherein it comprises several phases, especially two or three or four phases, each including the first step and the second step.
15. The process as defined in one of the preceding points, wherein the first step and/or the second step is performed at a temperature of between 100° C. and 280° C. and in particular between 100° C. and 200° C.
16. The process as defined in one of the preceding points, wherein the layers each integrally cover the base of the timepiece component.

A timepiece component according to the invention is defined by point 17 below.

17. A timepiece component (10), in particular a hairspring, obtained by performing the process as defined in one of the preceding points.

A timepiece movement according to the invention is defined by point 18 below.

18. A movement comprising a timepiece component as defined in the preceding point.

A timepiece item according to the invention is defined by point 19 below.

19. A timepiece item, especially a watch, comprising a movement as defined in the preceding point or a timepiece component as defined in point 17.

A timepiece component according to the invention is defined by point 20 below.

20. A timepiece component, especially a hairspring, wherein it comprises a base and a coating including:
  a first layer of a first oxide or of a first nitride or of a first carbide; and
  a second layer of a second oxide or of a second nitride or of a second carbide.

Various embodiments of the component are defined by points 21 to 34 below.

21. A timepiece component, especially a hairspring, wherein it comprises a base and a coating including a first layer of a first oxide and a second layer of a second oxide.
22. The component as defined in the preceding point, wherein:
  the first oxide, and/or
  the second oxide, and/or
  both the first oxide and the second oxide in the form of a first layer and a second layer, have a negative thermoelastic coefficient.
23. The process as defined in either of points 21 and 22, wherein the base, on the one hand, and at least one of the layers, on the other hand, have thermoelastic coefficients of opposite signs.
24. The component as defined in one of points 21 to 23, wherein the first oxide is $ZrO_2$ or $TiO_2$ or $HfO_2$ or $ZnO$ or, preferentially, $Al_2O_3$.
25. The component as defined in one of points 21 to 24, wherein the second oxide is different from the first oxide and is $Al_2O_3$ or $ZrO_2$ or $HfO_2$ or $ZnO$ or, preferentially, $TiO_2$.
26. The component as defined in one of points 21 to 25, wherein the base of the timepiece component is made of an alloy of NbZr type or of silicon or of silicon covered with $SiO_2$ or of an alloy of FeNiCr type.
27. The component as defined in one of points 21 to 26, wherein:
  the thickness of the first layer is between 2 nm and 60 nm, preferably between 2 nm and 15 nm and preferably between 3 nm and 12 nm, or
  if the base of the timepiece component is made of an alloy of NbZr type or an alloy of FeNiCr type, the thickness of the first layer is between 2 nm and 15 nm and preferably between 3 nm and 12 nm, or
  if the base of the timepiece component is made of silicon or of silicon coated with $SiO_2$, the thickness of the first layer is between 3 nm and 60 nm, preferably between 20 nm and 60 nm and preferably between 40 nm and 60 nm.
28. The component as defined in one of points 21 to 27, wherein:
  the thickness of the second layer is between 2 nm and 60 nm, preferably between 2 nm and 15 nm and preferably between 3 nm and 12 nm, or
  if the base of the timepiece component is made of an alloy of NbZr type or an alloy of FeNiCr type, the thickness of the second layer is between 2 nm and 15 nm and preferably between 3 nm and 12 nm, or
  if the base of the timepiece component is made of silicon or of silicon coated with $SiO_2$, the thickness of the second layer is between 3 nm and 60 nm, preferably between 20 nm and 60 nm and preferably between 40 nm and 60 nm.
29. The component as defined in point 20, wherein the first nitride is AlTiCN or AlN or TiN.
30. The component as defined in either of points 20 and 29, wherein the second nitride is different from the first nitride and is AlTiCN or AlN or TiN.
31. The component as defined in one of points 20 to 30, wherein the first layer and/or the second layer have a nanometric thickness.
32. The component as defined in one of points 20 to 31, wherein the first layer and/or the second layer are deposited via a procedure of ALD deposition type.
33. The component as defined in one of points 20 to 32, wherein the coating comprises several superpositions, especially two or three or four superpositions, each including a first layer, especially a first layer of a first oxide, and a second layer, especially a second layer of a second oxide.
34. The component as defined in one of points 20 to 33, wherein the layers each integrally cover the base of the timepiece component.

A timepiece movement according to the invention is defined by point 35 below.

35. A movement comprising a timepiece component as defined in one of point 20 to 34.

A timepiece item according to the invention is defined by point 36 below.

36. A timepiece item, especially a watch, comprising a movement as defined in the preceding point or a timepiece component as defined in points 20 to 34.

The attached drawings represent, by way of example, various modes of implementation of a process according to the invention and various embodiments of a timepiece component according to the invention.

Figure 1:
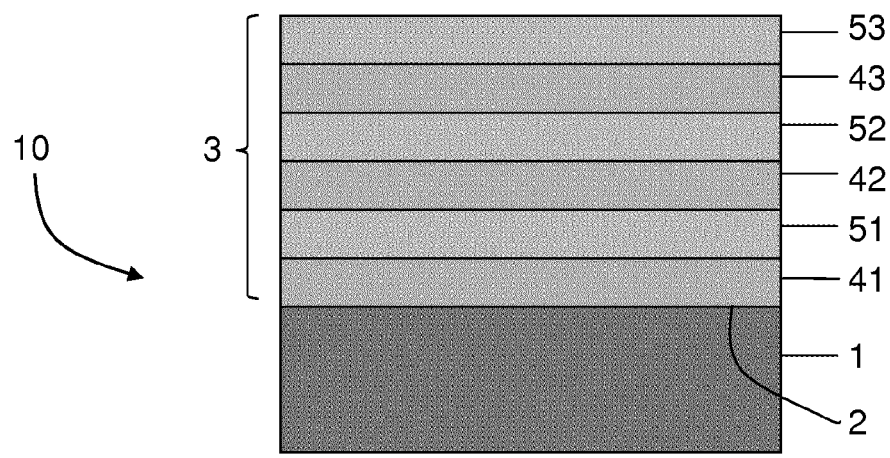
FIG. 1 is a view in partial cutaway of a timepiece component obtained using a first mode of implementation of the invention.

In a first mode of implementation of the surface treatment process, the surface 2 of a base 1 (or of a substrate) of a timepiece component 10 (shown in FIG. 1) is treated, in particular the surface of a base of a hairspring is treated. The base of the timepiece component may be made of NbZr alloy.

In a first step, a first layer 41 of a first oxide, for example the oxide $Al_2O_3$, is deposited, and then, in a second step, a second layer 51 of a second oxide, for example the oxide $TiO_2$, is deposited.

Preferably, several phases are successively repeated, especially two or three or four phases, each including the first step and the second step. In the first mode of implementation, a succession of three phases is performed.

Using this mode of implementation produces a multilayer coating 3 or coating composed of several alternating layers 41, 51, 42, 52, 43, 53 of the oxides $Al_2O_3$ and $TiO_2$. This coating is represented in FIG. 1. Preferably, this coating covers the entire surface of the timepiece component. This coating applied to a hairspring, for example with a thickness of 11 nm for each layer, gives excellent results in terms of rate stability of the oscillator of which it forms part. This coating also has the feature of rendering a deep blue color.

To produce such a coating, use is preferably made of an ALD (atomic layer deposition) deposition technique. One or more hairsprings 1 to be treated are laid on metal supports (for example made of stainless steel or aluminum) or on plastic supports that withstand the temperature required for the deposition (maximum 200° C.) and that are suitable for working under vacuum. Such plastic supports are made, for example, of PEEK (polyether ether ketone) or of PPS (polyphenylene sulfide). The supports that hold the hairspring(s) are then placed inside an ALD reactor.

Once the deposition temperature has been reached inside the charged reactor, the hairspring(s) are alternately exposed to chemical precursors. The deposition is preferentially performed under a continuous stream of dinitrogen $N_2$, for example about 20 sccm (standard cubic centimeters per minute) and/or, for example, under a pressure of about 20 Pa. In the first step, the substrate, i.e. especially the hairsprings, is sequentially or alternately exposed to vapors of trimethylaluminum (TMA) and of water ($H_2O$) to form (in successive partial layers) a layer of oxide $Al_2O_3$, for example 0.11 nm thick per exposure cycle. Next, in a second step, the hairsprings are sequentially or alternately exposed to vapors of tetrakis(dimethylamido)titanium (TDMAT) and of water ($H_2O$) to form (in successive partial layers) a layer of oxide $TiO_2$ with a deposition rate of 0.045 nm per exposure cycle.

The base pressure in the chamber, reached when no precursor or gas flow is present, may depend on the characteristics of the empty chamber and on the pumps, and may be, for example, less than or equal to 0.1 Torr (<20 Pa), and preferably less than 0.01 Torr (<2 Pa).

For example, the pressure in the chamber reached under a stream of dinitrogen is typically 20 Pa, with a working window between 10 Pa and 50 Pa. The pressure may depend on the deposition chamber, and the nature and surface of the components to be coated.

Depositions such as those shown in FIG. 1 were performed at 100, 120, 140, 200 and 280° C. From the point of view of the rate stability, the depositions performed between 100° C. and 280° C. are satisfactory, since they allow adequate rate stabilization. The temperature of 280° C. is high: it presents a risk of degradation of the chemical precursors used. A deposition temperature of between 100° C. and 200° C. thus appears to constitute a good compromise.

Thus, an ALD (atomic layer deposition) deposition technique is used to deposit the first and second layers, i.e. a particular thin-layer deposition technique which makes it possible to obtain layers and multilayers of nanometric thickness on a wide variety of substrates. In contrast with vapor-phase deposition (PVD) or chemical vapor deposition (CVD), the layers are formed directly on the surface of the substrate, via a reaction between (at least) two chemical precursors that are introduced sequentially and separately into a deposition chamber. This deposition chamber or ALD reactor makes it possible to reach a base pressure of less than 20 Pa, more preferably less than 2 Pa (with the units generally used by specialists of the art, the pressure is preferably less than or equal to 0.01 Torr).

A deposition "cycle" thus comprises the introduction of a first precursor into the chamber in gaseous form for a given time, at a given flow rate (generally controlled by the duration of introduction of the gas or "pulse" duration and by the vapor pressure of the gas, which is itself controlled by the temperature). To form alumina $Al_2O_3$, this first precursor is, for example, TMA (trimethylaluminum), borne by a carrier gas which is generally dinitrogen. A small portion of the first precursor becomes deposited on the surface of the substrate (and of the walls of the chamber) and reacts chemically with the —$OH^-$ end groups present on the surface to be coated, while the remainder is removed by vacuum pumps.

A second precursor is then introduced, for example water in the form of water vapor, which will react with the first precursor adsorbed onto the surface to form alumina. The thickness of the layer formed during a deposition cycle will depend on the material deposited, and is typically 0.11 nm for $Al_2O_3$. The cycles are then repeated until the desired layer thickness for the given material is obtained.

The multilayers are prepared by modifying the nature of the precursors, and in particular the nature of the first precursor. With TDMAT (tetrakis(dimethylamido)titanium) as first precursor in combination with water as second precursor, $TiO_2$ is thus obtained at a rate typically of 0.044 nm per cycle. With other precursors, it is possible to obtain other oxides, for instance $ZrO_2$, $HfO_2$ or ZnO.

An oxide layer, for example a layer of native oxide, generally comprises —OH end groups at the surface which facilitate the deposition. Alternatively, the surface may be oxidized before deposition or the order of introduction of the precursors may be inverted. The doses of precursors introduced into the chamber depend on the characteristics of the deposition chamber, on the nature and on the surface of the pieces to be coated. The pressure reached under a stream of dinitrogen, which may or may not be continuous, is typically 20 Pa, with a working window generally located between 10 and 50 Pa, and will also depend on the deposition chamber.

The ALD deposition process thus makes it possible to deposit ceramic layers (oxides, nitrides and carbides) of very low thicknesses, which are extremely uniform and perfectly controlled at the sub-nanometric scale. This makes it possible to coat surfaces in three dimensions that are irregular and very complex from a geometrical viewpoint, which would be difficult to coat via other thin-layer deposition techniques.

The presence on a hairspring of a coating obtained via layers prepared by depositions according to an ALD technique was also observed, surprisingly, on the parts of the hairspring in contact with the support. Moreover, the quality (uniformity of thickness and of color) on these parts does not differ from those of the directly exposed parts of the hairspring. The consequence of this is that it greatly facilitates the preparation of the supports and the implementation of the treatment process, and it minimizes the manipulations to be performed on the components to be treated or coated. If this were not the case, it would have been necessary to avoid any contact between the surfaces to be coated and the support. The implementation constraints of the process would therefore have been markedly more pronounced.

It is noted that a heat treatment performed after carrying out the treatment process, either under forming gas, or under dinitrogen, for example at 150 or 200° C., does not degrade the rate stability of the hairsprings.

Figure 2:
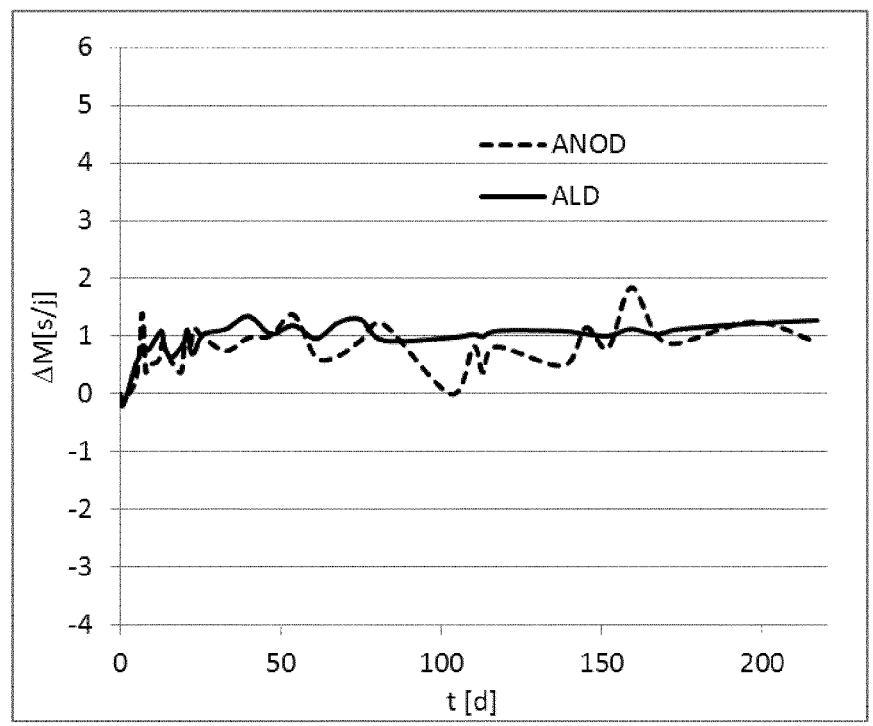
FIG. 2 is a diagram illustrating the changes in average rate of timepiece movements as a function of time, for two batches of movements comprising, respectively, hairsprings treated according to the process that is the subject of the invention and hairsprings treated according to a process of the prior art.

FIG. 2 illustrates the changes in mean rate of timepiece movements as a function of time, for two batches of movements. The two batches of movements are equipped with hairsprings made of NbZr alloy. A first batch contains anodized hairsprings, for example hairsprings treated according to the process of document EP 1 039 352. The changes in the rate of these movements are shown by a curve referenced "ANOD". A second batch contains hairsprings treated according to the first mode of implementation of the treatment process. The changes in the rate of these movements are represented by a curve referenced "ALD". A slight drift is noted during the first days of functioning, of less than one second per day. The rate is then entirely stable over time for the duration of the test. The results obtained with hairsprings treated according to the invention is entirely comparable to those obtained with hairsprings treated by anodization according to document EP 1 039 352.

In the various modes of implementation of the process, the first layer and/or the second layer may have a nanometric thickness, i.e. a thickness of a few nanometers, for example less than 100 nm, in particular less than 60 nm, and more particularly less than 20 nm. For example, the thickness of the first layer is between 2 nm and 15 nm, preferably between 3 nm and 12 nm and/or the thickness of the second layer is between 2 nm and 15 nm and preferably between 3 nm and 12 nm.

In the various modes of implementation of the process, the total thickness of the coating 3 is preferentially chosen between 10 and 300 nm, more preferentially chosen between 10 nm and 150 nm and even more preferentially between 10 nm and 80 nm, so as to be able to ensure the efficacy of the deposition and so as not to degrade the properties of the component and/or of the deposit.

The maximum thickness is set so as to minimize the risk of cracking of the coating on account of the residual constraints created at the substrate-coating interface during deposition. This point is important for components such as timepiece hairsprings, which are mechanically stressed in traction/compression or in bending. Furthermore, the thinner the deposited coating, the less the mechanical properties of the hairsprings are modified.

Various tests were conducted for different multilayer coatings deposited according to the process onto a substrate made of NbZr alloy by varying the thickness of the layers, with the results given in the following table:

| Structure | Color | Total thickness | Rate stability |
|---|---|---|---|
| 2 bilayers (3 nm $Al_2O_3$/3 nm $TiO_2$) | Gray | 12 nm | good |
| 3 bilayers (5 nm $Al_2O_3$/5 nm $TiO_2$) | Ochre | 30 nm | very good |
| 3 bilayers (9 nm $Al_2O_3$/9 nm $TiO_2$) | Blue | 54 nm | very good |
| 3 bilayers (11 nm $Al_2O_3$/11 nm $TiO_2$) | Blue | 66 nm | excellent |

It is thus seen that the thickness of the oxide layer is relatively unimportant for achieving good rate stability, and as such this thickness may also be chosen as a function of the desired color. Thus, with the structures of layers used, it is possible readily to obtain layers of blue, mauve, fuchsia, orange, ochre and gray-green color (see FIGS. 3 and 4). As will be seen hereinbelow, by modifying the materials used, other colors may be achieved.

Figure 3:
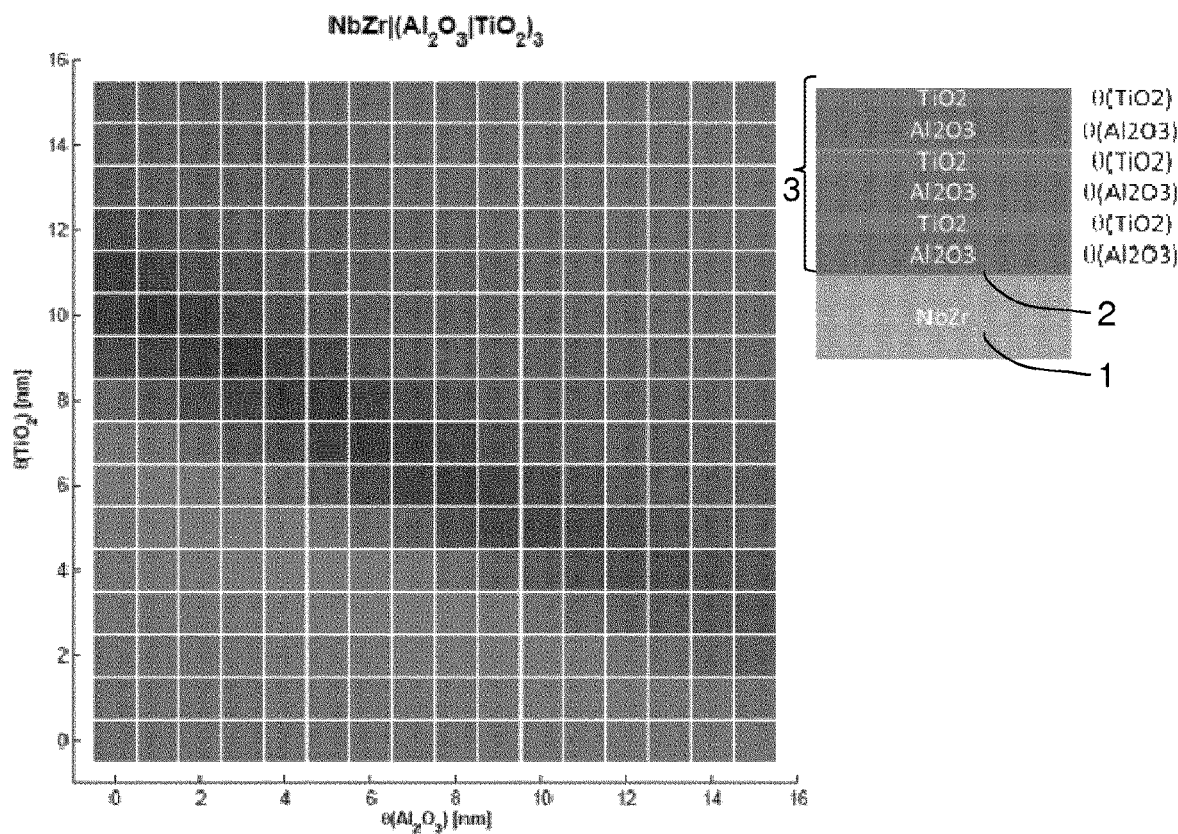
FIG. 3 is a diagram illustrating the range of colors that may be obtained by depositing several oxide layers onto a substrate made of NbZr alloy.

FIG. 3 illustrates the range of colors that may be obtained by selecting a first thickness of the first layers of oxide $Al_2O_3$ and a second thickness of the second layers of oxide $TiO_2$, in the case of performing the process for preparing a coating including the superposition of six alternating layers of oxides on a timepiece component comprising a base or a substrate made of NbZr alloy. All the $Al_2O_3$ layers have the same thickness $\theta(Al_2O_3)$. All the layers of $TiO_2$ have the same thickness $\theta(TiO_2)$. This figure, and also the following figures, was obtained by numerically calculating the spectral distribution of the light power reflected by a sample illuminated with normal incidence by a light source whose spectral distribution is given by the D65 colorimetric standard. This spectral distribution was then broken down in a given colorimetric space, for example L*a*b*, so as to represent the appearance of the sample.

Figure 4:
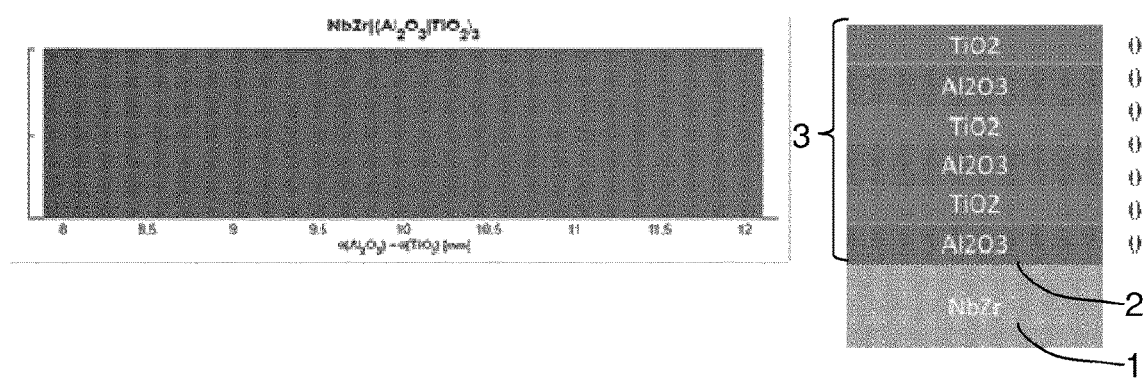
FIG. 4 is a diagram illustrating the range of colors that may be obtained by depositing several oxide layers of the same thickness onto a substrate made of NbZr alloy.

FIG. 4 illustrates the range of colors that may be obtained by selecting the same thickness for the first layers of oxide $Al_2O_3$ and for the second layers of oxide $TiO_2$, in the case of performing the process for preparing a coating including the superposition of six alternating layers of oxides on a timepiece component comprising a base or a substrate made of NbZr alloy. All the layers of $Al_2O_3$ and all the layers of $TiO_2$ have the same thickness $\theta$.

The thickness of the various layers may also be varied from one layer to another and from one material to another, without, in principle, any discernible technical effect (apart from the apparent color of the coating). If it is desired to obtain a blue-colored coating of the type comprising n double layers ($Al_2O_3$|$TiO_2$) with n between 3 and 5, an optimization leads to solutions close to those exposed above with n=3 and a thickness of each layer of 11 nm. The thickness of each layer may also be reduced to 8.5 nm or 9 nm and remain in a color close to that which may be seen in FIG. 4. Be that as it may, it is also necessary to take into account the fact that the formation of the coating modifies the elastic properties of the hairspring, by reducing the apparent elastic thermal coefficient of the hairspring (by about 5 ppm/° C. for the hairsprings referenced "ALD" in FIG. 2, which corresponds to a decrease in the thermal coefficient of the balance-spring oscillator of about 0.2 s/day/° C.) and by increasing the torque. It is thus necessary to take these differences into account when calculating the shape of the hairspring and the various treatments performed during the manufacture of the hairspring, so as to obtain the desired elastic thermal coefficient and desired torque after the deposition of the coating by performing the process that is the subject of the invention.

Tests were conducted with monolayers, especially of $Al_2O_3$ or of $TiO_2$. In the majority of cases, the rate stability obtained is unsatisfactory. The use of a multilayer structure is much more favorable than a single layer, since it makes it possible to obtain excellent rate stability with a reasonable layer thickness.

Combinations of materials other than ($Al_2O_3$|$TiO_2$) may be envisaged for obtaining good rate stability of timepiece hairsprings.

It is thus possible to use other metal oxides, in particular the oxide $ZrO_2$, and/or to combine layers of different oxides, in order to optimize multilayer coatings of six or more layers. It may thus be envisaged to use coatings of the type containing n ($Al_2O_3$|$ZrO_2$) double layers (see FIG. 5), of the type containing n ($TiO_2$|$ZrO_2$) double layers, or even other combinations between $Al_2O_3$, $ZrO_2$, $TiO_2$, $HfO_2$ and ZnO, containing two or more than two materials.

Figure 5:
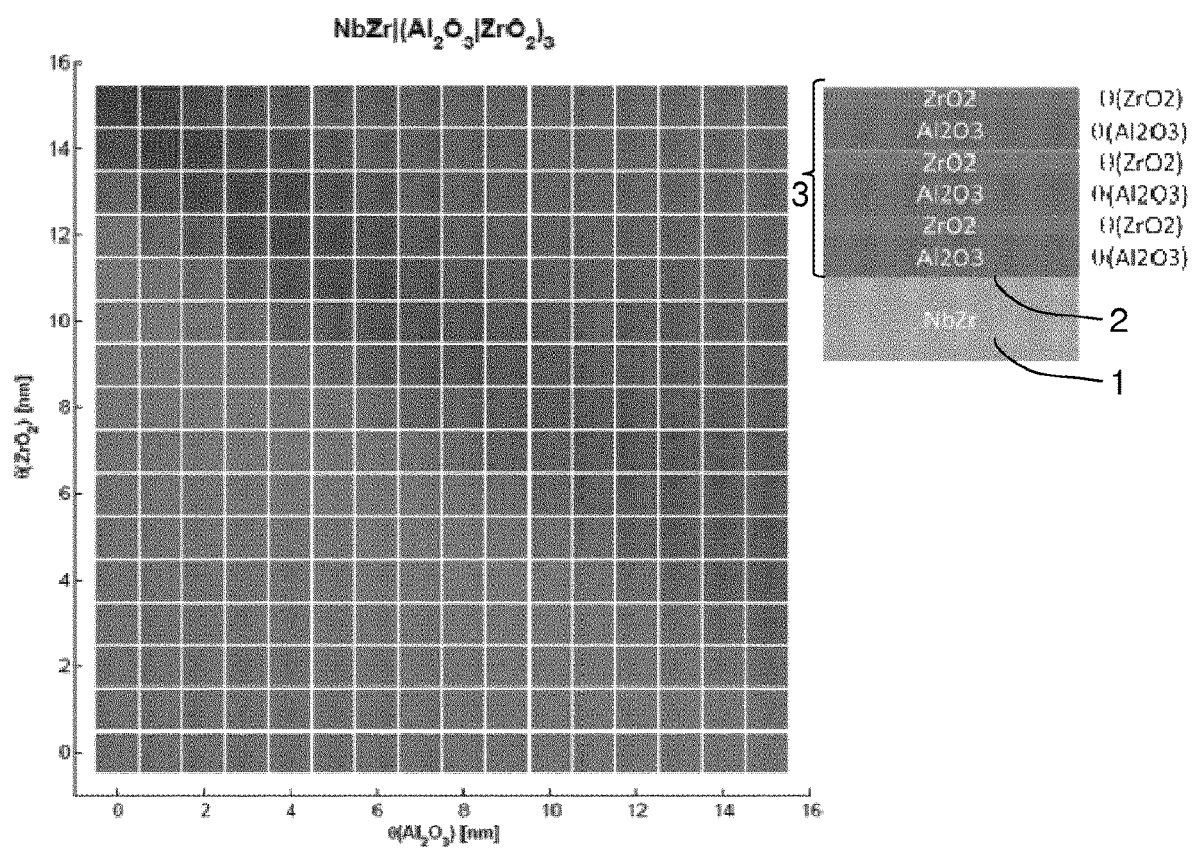
FIG. 5 is a diagram illustrating the range of colors that may be obtained by depositing several oxide layers onto a substrate made of NbZr alloy.

FIG. 5 illustrates the range of colors that may be obtained by selecting a first thickness of the first layers of oxide $Al_2O_3$ and a second thickness of the second layers of oxide $ZrO_2$, in the case of performing the process for preparing a coating including the superposition of six alternating layers of oxides on a timepiece component comprising a base or a substrate made of NbZr alloy. All the $Al_2O_3$ layers have the same thickness θ($Al_2O_3$). All the $ZrO_2$ layers have the same thickness θ($ZrO_2$).

In the case of multilayer deposits, it is also noted that it is possible to obtain a blue color, close to that of the target, even in the case of variations of the thicknesses of the various layers. When coupled with the capacity of the ALD technique to precisely control the thickness of the layers and the great reproducibility of the ALD technique, this ensures the robustness of the process.

Documents EP 0 886 195, EP 1 039 352 and EP 1 258 786 mention several paramagnetic alloys with adequate properties for preparing timepiece hairsprings, especially self-compensating hairsprings, i.e. hairsprings having an adequate value of the elastic thermal coefficient. Mention is thus made of the paramagnetic Nb—Zr alloy containing between 5% and 25% by weight of Zr and at least 500 ppm by weight of a dopant formed at least partly from oxygen; or alternatively paramagnetic alloys based on Nb, Ta, V; or alloys based on at least one element from the group Nb, V, Ta and an element from the group Ti, Zr, Hf, for instance Nb—Hf alloys with small proportions of Hf (especially between 2 at % and 4 at %). In another mode of implementation of the surface treatment process, the process is thus applied to a substrate made of an alloy of NbZr type or an alloy based on Nb or Ta or V or an alloy based on at least one element from the group Nb, V, Ta and an element from the group Ti, Zr, Hf, for instance Nb—Hf alloys with small proportions of Hf (especially between 2 at % and 4 at %).

Figure 6:
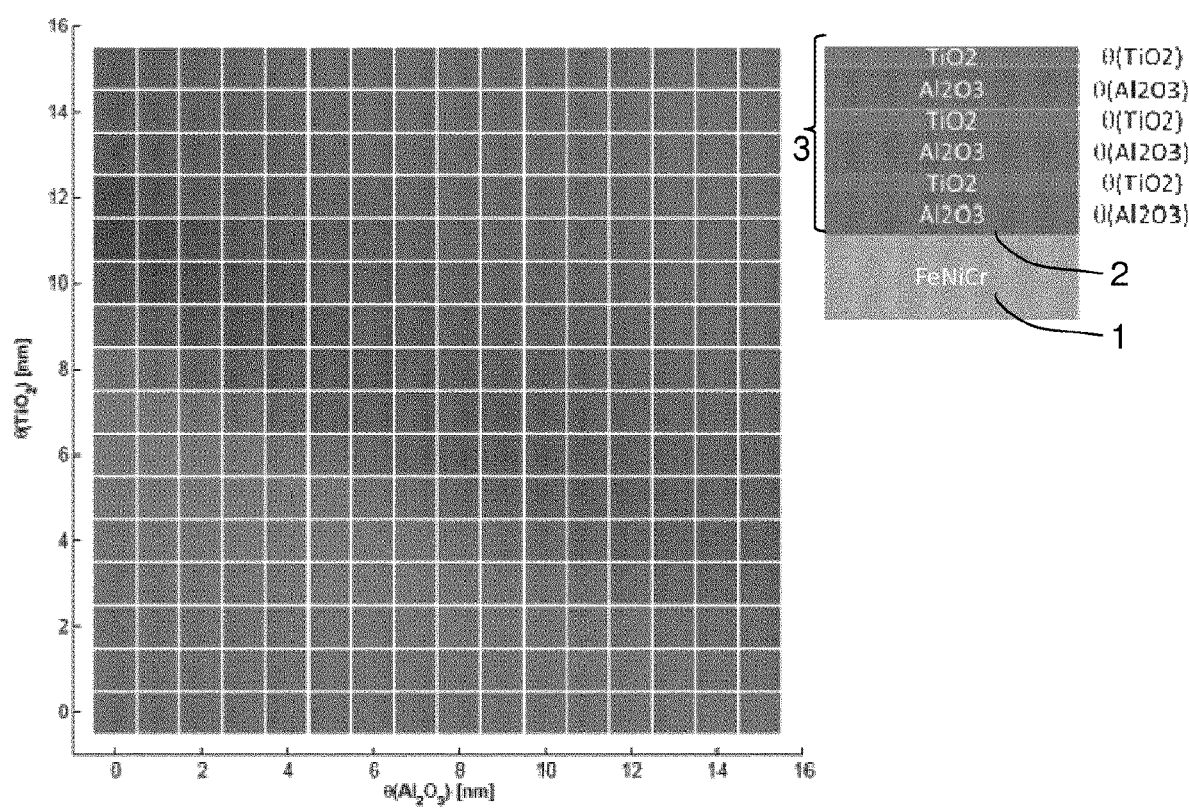
FIG. 6 is a diagram illustrating the range of colors that may be obtained by depositing several oxide layers onto a substrate made of FeNiCr alloy.

Ferromagnetic alloys based on iron, nickel or cobalt are frequently used for manufacturing hairsprings ("Nivarox" alloys of FeNiCr type, for example). Deposition tests were performed on such hairsprings: the deposition and the resulting rate stability are entirely satisfactory with a coating structure of six layers of [($Al_2O_3$|$TiO_2$)$_3$] type with layers 11 nm thick. The resulting color of the layer was pale blue in this case and may be optimized, if desired, as illustrated in FIG. 6. FIG. 6 illustrates the range of colors that may be obtained by selecting a first thickness of the first layers of oxide $Al_2O_3$ and a second thickness of the second layers of oxide $TiO_2$, in the case of performing the process for preparing a coating including the superposition of six alternating layers of oxides on a timepiece component comprising a base or a substrate made of FeNiCr alloy. All the $Al_2O_3$ layers have the same thickness θ($Al_2O_3$). All the $TiO_2$ layers have the same thickness θ($TiO_2$). Needless to say, it may also be envisaged to deposit a layer thickness that is different from one layer to another. In another mode of implementation of the surface treatment process, the process is thus applied to a substrate made of an alloy of FeNiCr type.

Figure 7:
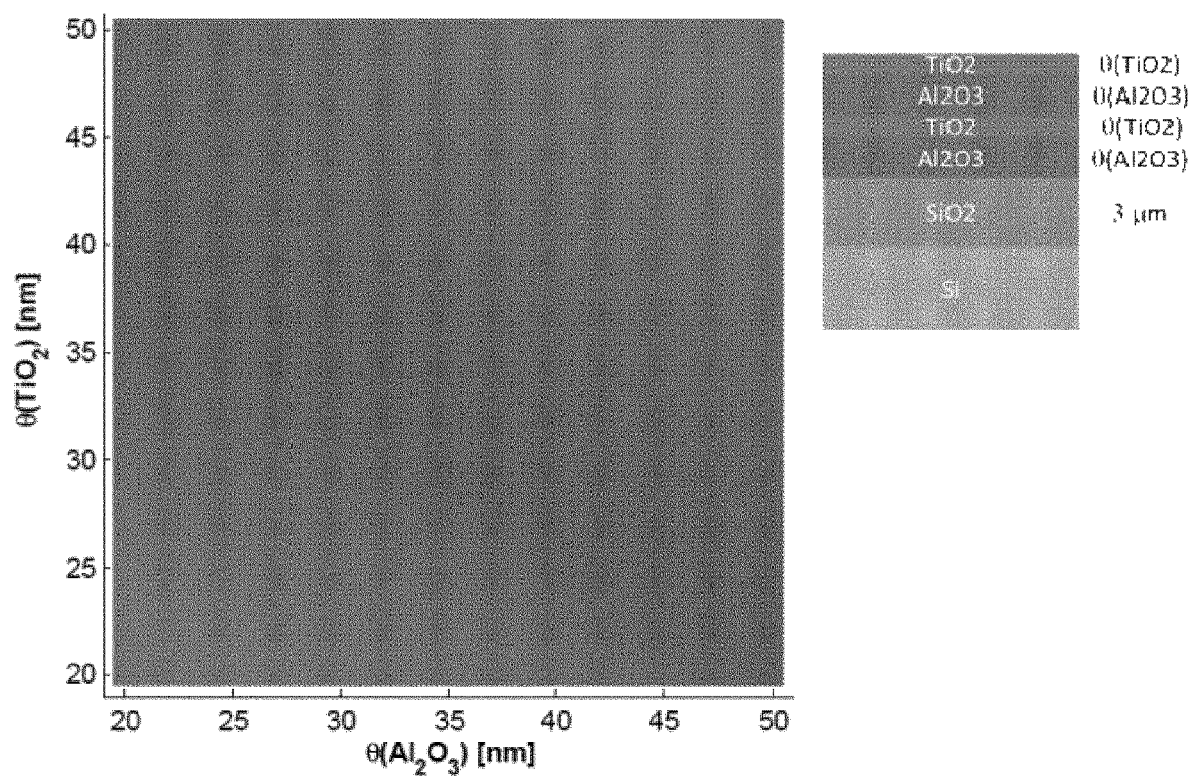
FIG. 7 is a diagram illustrating the range of colors that may be obtained by depositing several oxide layers onto a silicon substrate coated with a layer of silicon oxide.

Patent EP 1 422 436 describes the preparation of timepiece hairsprings made of silicon Si with a deposit of silicon oxide $SiO_2$ on the periphery to achieve the thermal compensation. The layer of oxide $SiO_2$ covering the silicon may have a thickness of about 3 μm. The use of an ALD deposition technique, for example of a deposit of ($Al_2O_3$|$TiO_2$)$_n$ type, also makes it possible to obtain good rate stability over time. The color may, in this case also, be adjusted with the thickness and the materials of the layers as illustrated in FIG. 7. FIG. 7 illustrates the range of colors that may be obtained by selecting a first thickness of the first layers of oxide $Al_2O_3$ and a second thickness of the second layers of oxide $TiO_2$ in the case of performing the process for preparing a coating including the superposition of four alternating layers of oxides on a timepiece component comprising a base or a substrate made of Si coated with a layer of silicon oxide. All the $Al_2O_3$ layers have the same thickness θ($Al_2O_3$). All the $TiO_2$ layers have the same thickness θ($TiO_2$). Satisfactory layers were thus obtained with alternating layers of 45 nm of $Al_2O_3$ and 50 nm of $TiO_2$. Needless to say, it may also be envisaged to deposit a layer thickness that is different from one layer to another. In another mode of implementation of the surface treatment process, the process is thus applied to a substrate made of silicon or of silicon coated with a silicon oxide.

In the various embodiments, the various layers of oxide may have different thicknesses, in particular the various layers of oxide of the same nature may have different thicknesses.

The surface treatment process according to the invention has many advantages:
  it makes it possible to stabilize the rate drift of timepiece hairsprings, especially of hairsprings made of a paramagnetic alloy such as Nb—Zr or made of a diamagnetic material such as Si;
  the deposition or coating is performed at low temperature without influencing the crystal structure of the hairspring;
  it makes it possible to adjust with very great simplicity and very good reproducibility the thickness of the deposited layers to the desired value;

the thickness of each layer and thus the color of the hairspring thus coated is very uniform;

it makes it possible to prepare layers each integrally and uniformly covering the base of the timepiece component, even on surfaces in contact with a support.

Throughout this document, the term "hairspring" means the hairspring alone or the hairspring and its base and/or its collet.

In the context of this invention, several types of coatings deposited via the ALD technique were prepared for the purpose of finding an alternative means to the anodization of the NbZr alloy which makes it possible to reduce the rate drift of hairsprings made of NbZr over time. It is possible to obtain results equivalent to anodization, or even better than anodization, by performing the deposition process that is the subject of the invention for depositing an oxide coating onto the surface of timepiece hairsprings.

The invention also relates to a timepiece component, especially a hairspring, obtained via the process.

The invention thus relates to such a component per se.

The component comprises a base 10 and a coating 3 including a first layer 4 of a first oxide and a second layer 51 of a second oxide.

The first layer and/or the second layer may have a nanometric thickness, i.e. a thickness of less than 100 nm.

The first layer and/or the second layer may be deposited via a procedure of ALD deposition type.

The first oxide may be $ZrO_2$ or $TiO_2$ or $HfO_2$ or ZnO or, preferentially, $Al_2O_3$. Other oxides may also be used.

In the case of using a first oxide, the second oxide may be different from the first oxide and may be $Al_2O_3$ or $ZrO_2$ or $HfO_2$ or ZnO or, preferentially $TiO_2$.

The base of the timepiece component may be made of an alloy of NbZr type or of silicon or of silicon covered with $SiO_2$ or of an alloy of FeNiCr type. The base of the timepiece component is not, however, limited to these materials, but may also be made of other suitable materials, such as diamond or quartz.

The base of the timepiece component may be made of an alloy based on Nb or Ta or V.

The coating may comprise several superpositions, especially two or three or four superpositions, each including a first layer and a second layer.

The component may be such that:
the thickness of the first layer is between 2 nm and 60 nm, preferably between 2 nm and 15 nm and preferably between 3 nm and 12 nm, or
if the base of the timepiece component is made of an alloy of NbZr type or of an alloy of FeNiCr type, the thickness of the first layer is between 2 nm and 15 nm and preferably between 3 nm and 12 nm, or
if the base of the timepiece component is made of silicon or of silicon coated with $SiO_2$, the thickness of the first layer is between 3 nm and 60 nm, preferably between 20 nm and 60 nm and preferably between 40 nm and 60 nm.

The component may be such that:
the thickness of the second layer is between 2 nm and 60 nm, preferably between 2 nm and 15 nm and preferably between 3 nm and 12 nm, or
if the base of the timepiece component is made of an alloy of NbZr type or of an alloy of FeNiCr type, the thickness of the second layer is between 2 nm and 15 nm and preferably between 3 nm and 12 nm, or
if the base of the timepiece component is made of silicon or of silicon coated with $SiO_2$, the thickness of the second layer is between 3 nm and 60 nm, preferably between 20 nm and 60 nm and preferably between 40 nm and 60 nm.

The layers may each integrally cover the base of the timepiece component.

The first and second layers are of different chemical nature.

The first oxide, and/or the second oxide, and/or both the first oxide and the second oxide in the form of a first layer and a second layer, advantageously have a negative thermoelastic coefficient.

Thus, the base, on the one hand, and at least one of the layers, on the other hand, have thermoelastic coefficients of opposite signs.

For example, hairsprings made of NbZr with layers according to the invention show a thermoelastic coefficient lower than that of hairsprings derived from the same manufacturing batch without an additional layer (difference in thermal coefficient of the balance-spring oscillator of −0.2 s/day/° C.). Similarly, the thermoelastic coefficient of hairsprings made of $Si/SiO_2$ with layers according to the invention is very markedly lower than that of hairsprings derived from the same manufacturing batch without an additional layer (difference in thermal coefficient of the balance-spring oscillator of −0.9 s/day/° C.). In both cases, this implies that the thermoelastic coefficient of the first and/or second oxide is highly negative, of the same sign as that of silicon, for example. In the hypothesis that the first and second oxide have the same thermoelastic coefficient, this thermoelastic coefficient may be estimated as approximately −500 ppm/° C. It is thus necessary to take into account the materials and the thicknesses of the various layers during the calculation of the shape of the hairspring and of the various treatments performed during the manufacture of the hairspring, in order to obtain a thermoelastic coefficient and a torque for the hairspring that are suitable for preparing a balance-spring oscillator or resonator that has good frequency and thermal compensation properties.

In one embodiment variant, the first layer 41 is made of a first nitride and/or the second layer 51 is made of a second nitride. It follows that the first and second layers may be oxides or nitrides or, respectively, an oxide and a nitride or, respectively, a nitride and an oxide.

The first nitride may be AlTiCN or AlN or TiN, but other nitrides may also be used.

In the case of using a first nitride, the second nitride is different from the first nitride and may be AlTiCN or AlN or TiN.

In another embodiment variant, the first layer 41 is made of a first carbide and/or the second layer 51 is made of a second carbide. It follows that the first and second layers may be oxides or nitrides or carbides.

Thus, the first and second layers may be:
oxides, or
nitrides, or
carbides, or
respectively, an oxide and a nitride, or
respectively, a nitride and an oxide, or
respectively, an oxide and a carbide, or
respectively, a carbide and an oxide, or
respectively, a nitride and a carbide, or
respectively, a carbide and a nitride.

The first or second carbide may be, for example, AlTiCN.

Unless logically or technically incompatible, all the characteristics of the component stated previously may be combined together.

The invention also relates to a movement comprising a timepiece component as defined previously.

The invention also relates to a timepiece item, especially a watch, comprising a movement as defined previously or a timepiece component as defined previously.

The invention claimed is:

1. A process for treating a silicon base of a timepiece component which is an oscillator component, the process comprising:
    a first step of depositing by atomic deposition a first layer of a first material which is $Al_2O_3$; and
    a second step of depositing by atomic deposition on the first layer a second layer of a second material which is $TiO_2$,
    wherein a combination of the first layer and second layer has a negative thermoelastic coefficient.

2. The process as claimed in claim 1, wherein the first and second layers are deposited on a layer of $SiO_2$ layer present on the silicon base.

3. The process as claimed in claim 2, wherein the $SiO_2$ layer has a thickness of about 3 µm.

4. The process as claimed in claim 1, wherein the oscillator component is a hairspring.

5. A timepiece component which is an oscillator component having a treated surface obtained by performing a process for treating a silicon base of the timepiece component, the process comprising:
    a first step of depositing by atomic deposition a first layer of a first material which is $Al_2O_3$; and
    a second step of depositing by atomic deposition on the first layer a second layer of a second material which is $TiO_2$,
    wherein a combination of the first layer and second layer has a negative thermoelastic coefficient.

6. The timepiece component as claimed in claim 5, wherein the first and second layers are deposited on a layer of $SiO_2$ layer present on the silicon base.

7. The timepiece component as claimed in claim 6, wherein the $SiO_2$ layer has a thickness of about 3 µm.

8. The timepiece component as claimed in claim 5, wherein the oscillator component is a hairspring.

9. A timepiece item comprising a timepiece component as claimed in claim 5.

10. A timepiece component which is an oscillator component comprising a silicon base and a coating on the base, the coating including:
    a first layer deposited by atomic deposition of a first material which is $Al_2O_3$; and
    on the first layer, a second layer deposited by atomic deposition of a second material which is $TiO_2$,
    wherein a combination of the first layer and second layer has a negative thermoelastic coefficient.

11. The timepiece component as claimed in claim 10, wherein the first and second layers are deposited on a layer of $SiO_2$ layer present on the silicon base.

12. The timepiece component as claimed in claim 11, wherein the $SiO_2$ layer has a thickness of about 3 µm.

13. The timepiece component as claimed in claim 10, wherein the first layer and the second layer each have a thickness in a range of from 2 nm to 15 nm.

14. The timepiece component as claimed in claim 10, wherein the first layer and the second layer form a double layer, and the coating comprises a plurality of double layers.

15. The timepiece component as claimed in claim 10, wherein the coating comprises:
    a first group of superposed layers including the first layer and the second layer, and
    a second group of superposed layers including a third layer and a fourth layer, the third layer being a layer deposited by atomic deposition of a first material which is $Al_2O_3$; and the fourth layer being a layer deposited on the third layer by atomic deposition of a second material which is $TiO_2$,
    the second group being superposed on the first group.

16. The timepiece component as claimed in claim 15, wherein the first layer, the second layer, the third layer and the fourth layer each have a thickness in a range of from 2 nm to 15 nm.

17. The timepiece component as claimed in claim 15, wherein the coating further comprises:
    a third group of superposed layers including a fifth layer and a sixth layer, the fifth layer being a layer deposited by atomic deposition of a first material which is $Al_2O_3$; and the sixth layer being a layer deposited on the fifth layer by atomic deposition of a second material which is $TiO_2$,
    the third group being superposed on the second group.

18. The timepiece component as claimed in claim 17, wherein the first layer, the second layer, the third layer, the fourth layer, the fifth layer and the sixth layer each have a thickness in a range of from 2 nm to 15 nm.

19. The timepiece component as claimed in claim 10, wherein the oscillator component is a hairspring.

20. A timepiece item comprising a timepiece component as claimed in claim 10.

* * * * *